United States Patent
Xiao et al.

(10) Patent No.: US 7,446,541 B2
(45) Date of Patent: Nov. 4, 2008

(54) SOLENOID TEST DEVICE

(75) Inventors: Ren-Jun Xiao, Shenzhen (CN);
Xiao-Lin Gan, Shenzhen (CN);
Yu-Kuang Ho, Tu-Cheng (TW)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 77 days.

(21) Appl. No.: 11/309,879

(22) Filed: Oct. 17, 2006

(65) Prior Publication Data
US 2008/0007270 A1 Jan. 10, 2008

(51) Int. Cl.
*G01R 31/02* (2006.01)
(52) U.S. Cl. ............... 324/537; 324/415; 324/649; 361/154; 361/173
(58) Field of Classification Search ............... 324/537
See application file for complete search history.

(56) References Cited

U.S. PATENT DOCUMENTS

| | | | | |
|---|---|---|---|---|
| 4,242,631 A | * | 12/1980 | Hall | 324/649 |
| 4,599,675 A | * | 7/1986 | Fisher et al. | 361/173 |
| 4,746,869 A | * | 5/1988 | Schrag et al. | 324/546 |
| 4,932,246 A | * | 6/1990 | Deutsch et al. | 73/114.45 |
| 5,784,245 A | * | 7/1998 | Moraghan et al. | 361/154 |
| 6,147,498 A | * | 11/2000 | Sumiya et al. | 324/415 |
| 2007/0279047 A1 | * | 12/2007 | Schumacher | 324/207.16 |

OTHER PUBLICATIONS

NA555, NE555, SA555, SE555 Precision Timers Data Sheet, SLF022F, Sep. 1973, Revised Jun. 2006, p. 10, Copyright 1973-2006, Texas Instruments, Incorporated.*

* cited by examiner

*Primary Examiner*—Vincent Q. Nguyen
*Assistant Examiner*—Benjamin M Baldridge
(74) *Attorney, Agent, or Firm*—Wei Te Chung

(57) ABSTRACT

A solenoid test device includes a clock circuit, a control circuit, and an output port configured for coupling to two ends of a solenoid. The clock circuit generates a clock signal and sends it to the control circuit. The control circuit periodically and alternately couples one of the two ends of the solenoid to ground via the output port under the control of the clock signal. The solenoid test device is used to generate a periodic control signal to test service life and stability of solenoids.

11 Claims, 1 Drawing Sheet

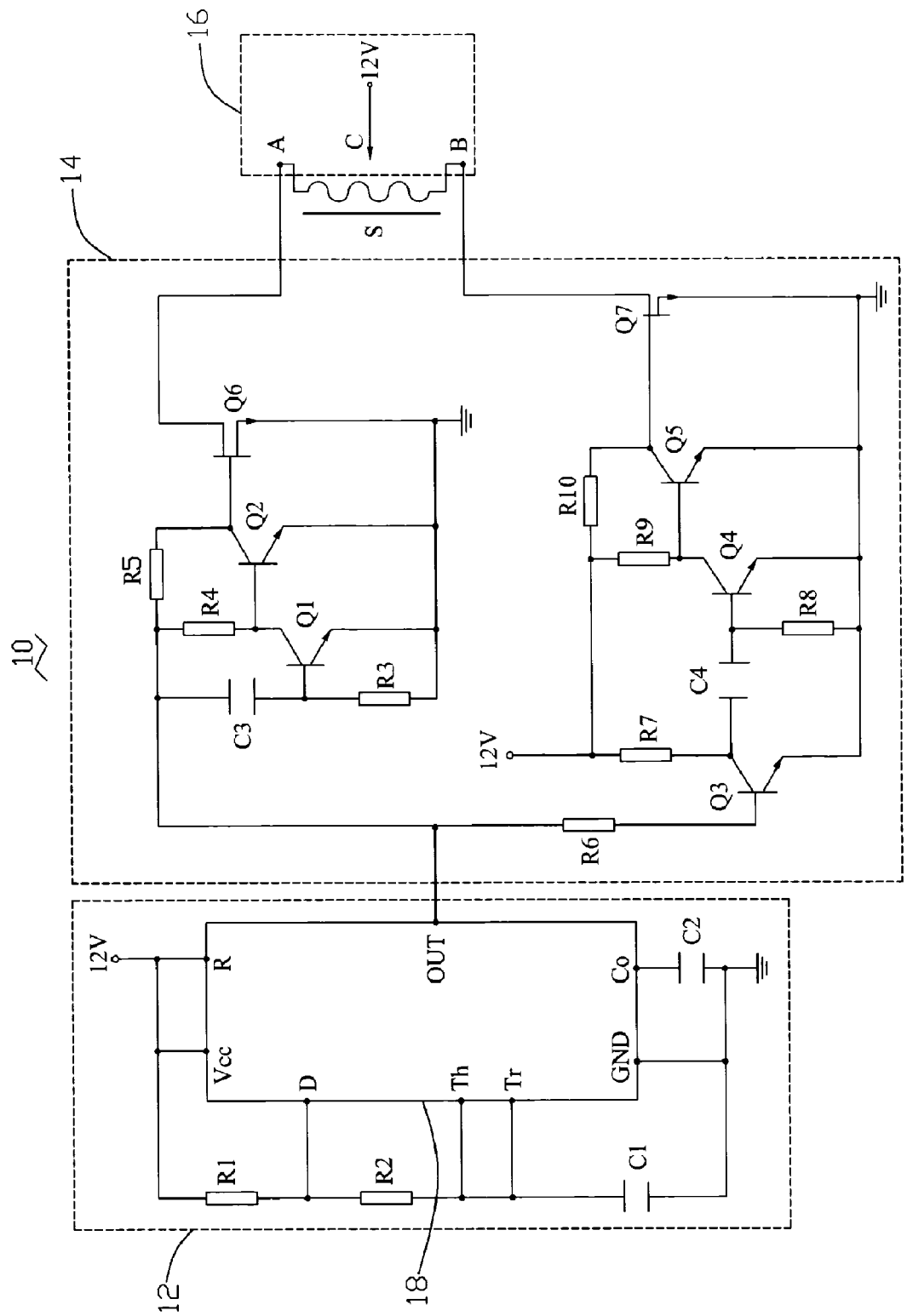

SOLENOID TEST DEVICE

FIELD OF THE INVENTION

The present invention relates to test devices, and particularly to a solenoid test device for testing service life and stability of solenoids.

DESCRIPTION OF RELATED ART

A solenoid is a loop of wire, often wrapped around a metallic core, which produces a magnetic field when an electrical current is passed through it. Solenoids are important because they can create controlled magnetic fields and can be used as electromagnets.

In physics, the term solenoid refers specifically to a magnet designed to produce a uniform magnetic field in a volume of space (where some experiment might be carried out).

In engineering, the term solenoid may also refer to a variety of transducer devices that convert energy into linear motion. The term is also often used to refer to a solenoid valve, which is an integrated device containing an electromechanical solenoid which actuates either a pneumatic or hydraulic valve, or a solenoid switch, which is a specific type of relay that internally uses an electromechanical solenoid to operate an electrical switch. For example, an automobile starter solenoid, or a linear solenoid, which is an electromechanical solenoid.

There are many manufacturers of computer controlled automobile transmissions. Each manufacturer's transmission may utilize a different type of control signal to the electronic control module (ECM) to activate one of the several solenoids. Furthermore, the solenoids may be of on/off or modulated/duty-cycled type of operation. Therefore, testing of service life and stability of solenoids is useful.

What is needed, therefore, is a solenoid test device which can test service life and stability of solenoids.

SUMMARY OF THE INVENTION

An exemplary solenoid test device includes a clock circuit, a control circuit, and an output port configured for coupling to two ends of a solenoid. The clock circuit generates a clock signal and sends it to the control circuit. The control circuit periodically and alternately couples one of the two ends of the solenoid to ground via the output port under the control of the clock signal.

Other advantages and novel features will become more apparent from the following detailed description when taken in conjunction with the accompanying drawing.

BRIEF DESCRIPTION OF THE DRAWINGS

The drawing is a circuit diagram of one embodiment of a solenoid test device in accordance with the present invention.

DETAILED DESCRIPTION OF THE INVENTION

Referring to the drawing, a solenoid test device 10 in accordance with a preferred embodiment of the present invention includes a clock circuit 12, a control circuit 14, and an output port 16.

The clock circuit 12 includes a clock generator 18 having a trigger pin Tr, an output pin OUT, a reset pin R, a start pin Th, a discharge pin D, a power pin Vcc, a ground pin GND, and a control pin Co. The reset pin R and the power pin Vcc of the clock generator 18 are coupled to a 12V power source. The start pin Th of the clock generator 18 is coupled to the trigger pin Tr of the clock generator 18. The ground pin GND of the clock generator 18 is coupled to ground.

A first resistor R1 is coupled between the power pin Vcc and the discharge pin D of the clock generator 18. A second resistor R2 is coupled between the discharge pin D and the start pin Th of the clock generator 18. A first capacitor C1 is coupled between the trigger pin Tr and the ground pin GND of the clock generator 18. A second capacitor C2 is coupled between the control pin Co and the ground pin GND of the clock generator 18.

The control circuit 14 includes a first transistor Q1, a second transistor Q2, a third transistor Q3, a fourth transistor Q4, a fifth transistor Q5, a first field-effect transistor Q6, and a second field-effect transistor Q7.

In this embodiment, the first, second, third, fourth, and fifth transistors Q1~Q5 are NPN transistors, and the first and second field-effect transistors Q6 and Q7 are N-channel field-effect transistors. A base of the first transistor Q1 is coupled to the output pin OUT of the clock generator 18 via a third capacitor C3 and ground via a third resistor R3. A collector of the first transistor Q1 is coupled to the output pin OUT of the clock generator 18 via a fourth resistor R4. An emitter of the first transistor Q1 is coupled to ground. A base of the second transistor Q2 is coupled to the collector of the first transistor Q1. A collector of the second transistor Q2 is coupled to the output pin OUT of the clock generator 18 via a fifth resistor R5. An emitter of the second transistor Q2 is coupled to ground. A gate of the first field-effect transistor Q6 is coupled to the collector of the second transistor Q2. A drain of the first field-effect transistor Q6 is coupled to ground.

A base of the third transistor Q3 is coupled to the output pin OUT of the clock generator 18 via a sixth resistor R6. A collector of the third transistor Q3 is coupled to the 12V power source via a seventh resistor R7. An emitter of the third transistor Q3 is coupled to ground. A base of the fourth transistor Q4 is coupled to the collector of the third transistor Q3 via a fourth capacitor C4 and ground via an eighth resistor R8. A collector of the fourth transistor Q4 is coupled to the 12V power source via a ninth resistor R9. An emitter of the fourth transistor Q4 is coupled to ground. A base of the fifth transistor Q5 is coupled to the collector of the fourth transistor Q4. A collector of the fifth transistor Q5 is coupled to the 12V power source via a tenth resistor R10. An emitter of the fifth transistor Q5 is coupled to ground. A gate of the second field-effect transistor Q7 is coupled to the collector of the fifth transistor Q5. A drain of the second field-effect transistor Q7 is coupled to ground.

The output port 16 includes a first terminal A, a second terminal B, and a third terminal C. The first terminal A of the output port 16 is coupled between a source of the first field-effect transistor Q6 and an end of a solenoid S. The second terminal B of the output port 16 is coupled between a source of the second field-effect transistor Q7 and another end of the solenoid S. The third terminal C of the output port 16 is coupled between the 12V power source and a power pin of the solenoid S. The first terminal A, second terminal B, and third terminal C also can be coupled to corresponding ends of a plurality of solenoids connected in parallel.

The clock circuit 12 generates a clock signal, and the frequency of the clock signal can be varied by adjusting resistances of the first and second resistors R1 and R2, and capacitances of the first and second capacitors C1 and C2. The control circuit 14 alternately couple the first terminal A and the second terminal B to ground, controlled by the clock signal, for making the solenoid S work. Therefore, the solenoid test device 10 can test service life and stability of solenoids.

It is believed that the present invention and its advantages will be understood from the foregoing description, and it will be apparent that various changes may be made thereto without departing from the spirit and scope of the invention or sacrificing all of its material advantages, the example hereinbefore described merely being a preferred or exemplary embodiment of the invention.

What is claimed is:

1. A solenoid test device for testing lifespan of a solenoid, comprising:
   a clock circuit for generating a periodic voltage signal;
   a control circuit comprising:
      a first branch comprising a first input terminal coupled to the clock circuit for receiving the periodic voltage signal, and a first output terminal generating a first periodic control signal;
      a second branch comprising a second input terminal coupled to the clock circuit for receiving the periodic voltage signal, and a second output terminal generating a second periodic control signal;
      a first field-effect transistor comprising a first gate, a first drain, and a first source, the first gate coupled to the first output terminal for receiving the first periodic control signal, the first drain being grounded, the first source coupled to a first end terminal of the solenoid; and
      a second field-effect transistor comprising a second gate, a second drain, a second source, the second base coupled to the second output terminal for receiving the second periodic control signal, the second drain being grounded, the second source coupled to a second end terminal of the solenoid; and
   a power source coupled to a node between the first and the second end terminals of the solenoid, wherein the first and second periodic control signals control the first and second field-effect transistor to be conductive alternately, thereby grounding the power source through the first and second end terminals of the solenoid alternately.

2. The solenoid test device as claimed in claim 1, wherein the clock circuit comprises:
   a clock generator having a trigger pin, an output pin, a reset pin, a start pin, a discharge pin, a power pin, a ground pin, and a control pin, the reset pin and the power pin coupling to a power source, the start pin coupled to the trigger pin, and the ground pin coupling to ground;
   a first resistor coupled between the power pin and the discharge pin of the clock generator;
   a second resistor coupled between the discharge pin and the start pin of the clock generator;
   a first capacitor coupled between the trigger pin and the ground pin of the clock generator; and
   a second capacitor coupled between the control pin and the ground pin of the clock generator.

3. The solenoid test device as claimed in claim 2, wherein the first branch of the control circuit comprises:
   a first transistor having a base coupled to the output pin of the clock generator via a third capacitor and ground via a third resistor, a collector coupled to the output pin of the clock generator via a fourth resistor, and an emitter coupled to ground; and
   a second transistor having a base coupled to the collector of the first transistor, a collector coupled to the gate of the first field-effect transistor, and the output pin of the clock generator via a fifth resistor, and an emitter coupled to ground; and
   wherein the second branch of the control circuit comprises;
   a third transistor having a base coupled to the output pin of the clock generator via a sixth resistor, a collector coupled to the power source via a seventh resistor, and an emitter coupled to ground;
   a fourth transistor having a base coupled to the collector of the third transistor via a fourth capacitor and ground via an eighth resistor, a collector coupled to the power source via a ninth resistor, and an emitter coupled to ground; and
   a fifth transistor having a base coupled to collector of the fourth transistor, a collector coupled to the gate of the second field-effect transistor, and the power source via a tenth resistor, and an emitter coupled to grounded.

4. The solenoid test device as claimed in claim 3, wherein the first, second, third, fourth, and fifth transistors are NPN transistors.

5. The solenoid test device as claimed in claim 3, wherein the first and the second field-effect transistors are N-channel field-effect transistors.

6. A solenoid test device for testing lifespan of a solenoid, the solenoid comprising two end terminals, and a middle terminal which is coupled to a power source, the test device comprising:
   a clock circuit for generating a periodic voltage signal, the clock circuit having an out pin; and
   a control circuit comprising two branches respectively coupled between the out pin of the clock circuit and the two end terminals, the two branches alternately coupling the two end terminals of the solenoid to ground, controlled by the periodic voltage signal, for making the solenoid work.

7. The solenoid test device as claimed in claim 6, wherein each of the branches comprises at least one transistor for receiving the periodic voltage signal from the out pin, and a field-effect transistor for periodically coupling a corresponding one of the two end terminals of the solenoid to ground.

8. The solenoid test device as claimed in claim 6, wherein the control circuit comprising:
   a first transistor having a base coupled to the output pin of the clock generator via a third capacitor and ground via a third resistor, a collector coupled to the output pin of the clock generator via a fourth resistor, and an emitter coupled to ground;
   a second transistor having a base coupled to the collector of the first transistor, a collector coupled to the output pin of the clock generator via a fifth resistor, and an emitter coupled to ground;
   a first field-effect transistor having a gate coupled to the collector of the second transistor, a drain coupled to ground, and a source;
   a third transistor having a base coupled to the output pin of the clock generator via a sixth resistor, a collector coupled to the power source via a seventh resistor, and an emitter coupled to ground;
   a fourth transistor having a base coupled to the collector of the third transistor via a fourth capacitor and ground via an eighth resistor, a collector coupled to the power source via a ninth resistor, and an emitter coupled to ground;
   a fifth transistor having a base coupled to the collector of the fourth transistor, a collector coupled to the power source via a tenth resistor, and an emitter coupled to ground; and
   a second field-effect transistor having a gate coupled to the collector of the fifth transistor, a drain coupled to ground, and a source.

9. The solenoid test device as claimed in claim 8, wherein the first, second, third, fourth, and fifth transistors are NPN transistors.

10. The solenoid test device as claimed in claim 8, wherein the first and the second field-effect transistors are N-channel field-effect transistors.

11. A solenoid test device comprising:
a clock circuit for generating a periodic voltage signal, the clock circuit comprising:
   a clock generator having a trigger pin, an output pin, a reset pin, a start pin, a discharge pin, a power pin, a ground pin, and a control pin, the reset pin and the power pin coupling to a power source, the start pin coupled to the trigger pin, and the ground pin coupling to ground;
   a first resistor coupled between the power pin and the discharge pin of the clock generator;
   a second resistor coupled between the discharge pin and the start pin of the clock generator;
   a first capacitor coupled between the trigger pin and the ground pin of the clock generator; and
   a second capacitor coupled between the control pin and the ground pin of the clock generator;
a control circuit coupled to the clock circuit for receiving the periodic voltage signal, and generating a periodic control signal, the control circuit comprising:
   a first transistor having a base coupled to the output pin of the clock generator via a third capacitor and ground via a third resistor, a collector coupled to the output pin of the clock generator via a fourth resistor, and an emitter coupled to ground;
   a second transistor having a base coupled to the collector of the first transistor, a collector coupled to the output pin of the clock generator via a fifth resistor, and an emitter coupled to ground;
   a first field-effect transistor having a gate coupled to the collector of the second transistor, a drain coupled to ground, and a source;
   a third transistor having a base coupled to the output pin of the clock generator via a sixth resistor, a collector coupled to the power source via a seventh resistor, and an emitter coupled to ground;
   a fourth transistor having a base coupled to the collector of the third transistor via a fourth capacitor and ground via an eighth resistor, a collector coupled to the power source via a ninth resistor, and an emitter coupled to ground;
   a fifth transistor having a base coupled to the collector of the fourth transistor, a collector coupled to the power source via a tenth resistor, and an emitter coupled to ground; and
   a second field-effect transistor having a gate coupled to the collector of the fifth transistor, a drain coupled to ground, and a source; and
an output port coupled between the control circuit and at least one solenoid, for transmitting the periodic control signal to the at least one solenoid.

* * * * *